United States Patent
Hakuma et al.

(10) Patent No.: US 9,166,077 B2
(45) Date of Patent: Oct. 20, 2015

(54) THIN FILM SOLAR CELL

(75) Inventors: Hideki Hakuma, Tokyo (JP); Hiroki Sugimoto, Tokyo (JP); Yoshiaki Tanaka, Tokyo (JP)

(73) Assignee: Solar Frontier K. K., Tokyo (JP)

( * ) Notice: Subject to any disclaimer, the term of this patent is extended or adjusted under 35 U.S.C. 154(b) by 0 days.

(21) Appl. No.: 13/702,912

(22) PCT Filed: Jun. 10, 2011

(86) PCT No.: PCT/JP2011/063858
§ 371 (c)(1),
(2), (4) Date: Dec. 7, 2012

(87) PCT Pub. No.: WO2011/155639
PCT Pub. Date: Dec. 15, 2011

(65) Prior Publication Data
US 2013/0074925 A1    Mar. 28, 2013

(30) Foreign Application Priority Data

Jun. 11, 2010   (JP) ................................. 2010-133738

(51) Int. Cl.
H01L 31/0224    (2006.01)
H01L 31/032     (2006.01)
H01L 31/0392    (2006.01)
H01L 31/056     (2014.01)

(52) U.S. Cl.
CPC H01L 31/022433 (2013.01); H01L 31/022425 (2013.01); H01L 31/0322 (2013.01); H01L 31/03923 (2013.01); H01L 31/056 (2014.12); Y02E 10/52 (2013.01); Y02E 10/541 (2013.01)

(58) Field of Classification Search
CPC ................................................ H01L 31/022433
USPC ................................... 136/262.264, 265, 256
See application file for complete search history.

(56) References Cited

U.S. PATENT DOCUMENTS

| | | | | |
|---|---|---|---|---|
| 5,028,274 A | * | 7/1991 | Basol et al. | 136/264 |
| 5,626,688 A | * | 5/1997 | Probst et al. | 136/265 |
| 2006/0096635 A1 | * | 5/2006 | Tuttle | 136/262 |
| 2007/0012356 A1 | * | 1/2007 | Nanu et al. | 136/264 |

(Continued)

FOREIGN PATENT DOCUMENTS

| | | |
|---|---|---|
| CN | 101443929 | 5/2009 |
| JP | 9-283779 | 10/1997 |

(Continued)

OTHER PUBLICATIONS

Hsu et al. Photoreflectance of sulfur-annealed copper indium disulfide. Journal of Applied Physics 1990 vol. 68, p. 283-287.*

(Continued)

*Primary Examiner* — Jeffrey T Barton
*Assistant Examiner* — Meisha Binkley
(74) *Attorney, Agent, or Firm* — Morrison & Foerster LLP (57) ABSTRACT

Disclosed is a thin-film solar cell which has a high photoelectric conversion efficiency and is provided with a substrate (1), a backside surface electrode layer (2) formed on the substrate (1), a p-type light-absorbing layer (3) formed on the backside surface electrode layer (2), and an n-type transparent conductive film (5) formed on the p-type light-absorbing layer (3). Voids (6) are formed at the interface of the backside surface electrode layer (2) and the p-type light-absorbing layer (3).

9 Claims, 5 Drawing Sheets

(56) References Cited

U.S. PATENT DOCUMENTS

| | | | |
|---|---|---|---|
| 2009/0269877 A1* | 10/2009 | Pinarbasi et al. | 438/98 |
| 2011/0226336 A1* | 9/2011 | Gerbi et al. | 136/262 |
| 2011/0308616 A1* | 12/2011 | Kamada et al. | 136/262 |

FOREIGN PATENT DOCUMENTS

| | | |
|---|---|---|
| JP | 2000-87234 | 3/2000 |
| JP | 2001-274176 | 10/2001 |
| JP | 2007-335625 | 12/2007 |
| JP | 2009-152302 | 7/2009 |
| WO | WO-2006/053127 | 5/2006 |
| WO | WO-2011/040272 | 4/2011 |
| WO | WO 2011040272 A1 * | 4/2011 |

OTHER PUBLICATIONS

Shen et al. Highly doped p-type and n-type ZnS, ZnSe, CdS and CdSe thin films growth by pulsed laser deposition. Materials Research Society Symposium Proceedings 1994 vol. 340, p. 457-461.*

U.S. Appl. No. 61/314,840.*

Hakuma et al., U.S. Appl. No. 13/379,871, filed Dec. 21, 2011.

Werner, A. et al. (Feb. 2000). "Investigation of the Influence of Silver on the Crystal Growth of $CuInS_2$ Thin Films," *Thin Solid Films* 361-362: 88-92.

International Search Report mailed Aug. 2, 2011, directed to International Application No. PCT/JP2011/063858; 4 pages.

Office Action mailed Nov. 4, 2014, directed to CN Application No. 201180028708.2; 7 pages.

* cited by examiner

THIN FILM SOLAR CELL

REFERENCE TO RELATED APPLICATIONS

This application is the national stage application under 35 USC 371 of International Application No. PCT/JP2011/063858, filed Jun. 10, 2011, which claims priority from Japanese Patent Application No. 2010-133738, filed Jun. 11, 2010, the entire contents of which are incorporated herein by reference.

FIELD OF THE INVENTION

The present invention relates to a thin film solar cell, more particularly relates to a thin film solar cell which can achieve a high photovoltaic conversion efficiency.

BACKGROUND OF THE INVENTION

In recent years, a CIS-based thin film solar cell which uses a Group I-III-VI$_2$ compound semiconductor of a chalcopyrite structure which contains Cu, In, Ga, Se, and S as a p-type light absorption layer has come into focus. This type of solar cell is comparatively cheap in manufacturing cost and further has a large coefficient of absorption in the wavelength range from visible to near infrared, so promises a high photovoltaic conversion efficiency. It is deemed as a promising candidate of next generation type solar cells. As typical materials, there are Cu(In, Ga)Se$_2$, Cu(In, Ga)(Se, S)$_2$, CuInS$_2$, etc.

A CIS-based thin film solar cell is obtained by forming a metal backside electrode layer on a substrate, forming a Group I-III-VI$_2$ compound, that is, a p-type light absorption layer, on that, and further forming an n-type high resistance buffer layer and n-type transparent conductive film forming a window layer successively on it.

The p-type light absorption layer is formed by forming a metal precursor film on the backside electrode by the sputtering method etc. and heat treating this by the selenization/sulfurization method. When using a metal precursor film constituted by a CuGa/In multilayer film, the p-type light absorption layer becomes a Cu(InGa)(SeS)$_2$ layer. It is known that in this selenization step, Se reacts with the CuGa/In multilayer film (Cu+Se→Cu$_2$Se, In+Se→In$_2$Se$_3$, Ga+Se→Ga$_2$Se$_3$) and that in the process, volume expansion occurs, strain occurs inside, and voids of several μm size are formed in the layer (for example, PLT 1, paragraph s (0005), (0006)).

It had been believed that such voids had a detrimental effect on the solar cell characteristics and were a cause of reduced photovoltaic conversion efficiency. Therefore, in the past, a method of production which prevented the formation of such voids as much as possible was employed.

On the other hand, in a crystalline Si solar cell which is made from a Si wafer, to further improve the photovoltaic conversion efficiency, it has been proposed to make the electrodes point contact structures. This has actually been applied. The contact interface between the semiconductor layer and the electrodes is a part which is high in dangling bond and other crystal defect density and where the carrier recombination rate becomes the highest. Therefore, in the prior art, the semiconductor layer and the electrodes are made to contact each other by points to reduce the ratio of front surface recombination and to improve the photovoltaic conversion efficiency. At the major part between the semiconductor layer and the electrodes, a good quality oxide film with a small speed of front surface recombination which functions as a passivation film is formed to realize a point contact structure and reduce the carrier recombination rate (for example, see PLT 2). Due to this, it is known that the open circuit voltage, one feature of a solar cell, is improved.

However, in a CIS-based thin film solar cell, the above-mentioned point contact structure is not realized. When applying the art for the above crystalline Si solar cell to a CIS-based thin film solar cell, it is necessary to form an insulating film between the semiconductor layer and the electrodes, but the art of forming such an insulating film has not been realized yet. While there is a possibility of realization by future technical innovation, in this case, it is believed that the production process becomes complicated and the production cost increases.

Furthermore, in a conventional Si-based solar cell, in particular a thin film Si solar cell, the light absorption coefficient of Si is low, so use of a BSR (back surface reflection) structure is the general practice. With this structure, light which strikes the front surface of the solar cell and passes through the semiconductor layer is again reflected at the back surface back to the inside of the semiconductor layer, so the incident light can be efficiently absorbed. The back surface internal reflectance is determined by the refractive index (N) of the semiconductor and the backside electrode and the angle of incidence of light to the back surface.

In this regard, in a CIS-based thin film solar cell, as the material of the backside electrode, Mo, Ti, Cr, etc. which are superior in selenium corrosion resistance are used, but these metals react with Se or S at the time of formation of the p-type light absorption layer. For example, when using Mo, MoSe$_2$, Mo(SSe)$_2$, or other reaction layer which has a refractive index of the same extent as a CIS layer is formed on the front surface of the backside electrode layer. For this reason, the reflectance between the two is low and an effective BSR structure is not realized.

As explained above, in a conventional CIS-based thin film solar cell, various measures have been taken to improve the photovoltaic conversion efficiency, but a point contact structure and BSR structure which are generally employed in solar cells made of Si and considered effective in improving the photovoltaic conversion efficiency have not been realized.

PLT 1: Japanese Patent Publication No. 2000-87234 A1
PLT 2: Japanese Patent Publication No. 9-283779 A1

SUMMARY OF THE INVENTION

The present invention was made for solving the above problems in a conventional CIS-based thin film solar cell. Specifically, it has as its object to realize a point contact structure and BSR structure in a CIS-based thin film solar cell to obtain a CIS-based thin film solar cell which has a high photovoltaic conversion efficiency.

In one embodiment of the present invention, to solve the problem, there is provided a thin film solar cell which is provided with a substrate, a backside electrode layer which is formed on the substrate, a p-type light absorption layer which is formed on the backside electrode layer, and an n-type transparent conductive film which is formed on the p-type light absorption layer, wherein the interface of the backside electrode layer and the p-type light absorption layer interface is formed with voids.

The above p-type light absorption layer may be a semiconductor layer which is comprised of the Group I-III-VI$_2$. Further, in the above thin film solar cell, the degree of formation of the voids may be one whereby the ratio of contact of the backside electrode layer and the p-type light absorption layer at the interface becomes 80% or less. In this case, the degree of formation of the voids may be one whereby the ratio of contact between the backside electrode layer and the p-type light absorption layer at the interface becomes 70% or less.

In the above thin film solar cell, the front surface of the p-type light absorption layer which faces the voids may also be passivated by sulfur.

In the above thin film solar cell, the voids may also contain a gas mainly comprised of nitrogen.

In the above thin film solar cell, at the front surface of the backside electrode layer at the light receiving surface side, an intermediate layer which is comprised of a compound of the Group VI element which forms the p-type light absorption layer and an element which forms the backside electrode layer may be formed. In this case, the voids may be formed between the intermediate layer and the p-type light absorption layer.

According to the present invention, voids are formed at the interface between the backside electrode layer and the p-type light absorption layer. Due to the voids, the contact area of the backside electrode layer and the p-type light absorption layer is reduced. As a result, it is possible to easily realize a point contact structure without providing an insulating film etc. between the backside electrode layer and the p-type light absorption layer. Further, the difference between the refractive index of the gas inside of the voids and the refractive index of the p-type light absorption layer is large, so the internal reflectance at the interface of the two becomes high and this part functions as a BSR (back surface reflector) structure. As a result, it is possible to obtain a thin film solar cell which has a high photovoltaic conversion efficiency. Note that, if performing the sulfurization in forming the p-type light absorption layer by a Group I-III-VI$_2$ compound, the front surface of the p-type light absorption layer which faces the voids is passivated by sulfur, and the degree of recombination of carriers at that part is reduced. Due to this, furthermore, the photovoltaic conversion efficiency is improved.

DETAILED DESCRIPTION OF THE INVENTION

Below, various embodiments of the present invention will be explained with reference to the drawings. Note that, in the illustrations as schematic views in the following drawings, to facilitate understanding, the relationships of the layers are expressed by different sizes than the actual ones. Further, in the drawings, the same reference signs show the same or similar component elements.

Figure 1:
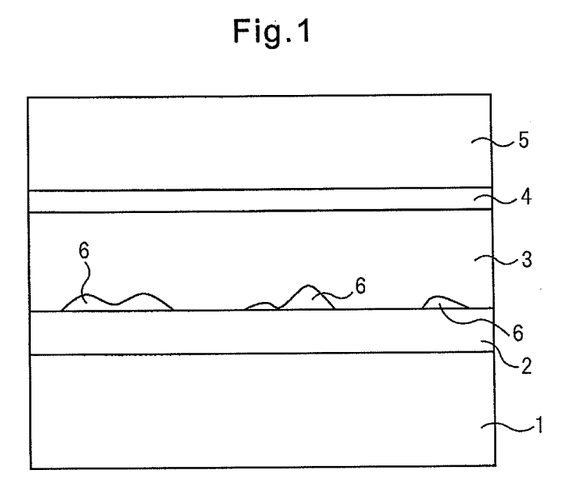
FIG. 1 is a cross-sectional view which shows the schematic configuration of a CIS-based thin film solar cell according to one embodiment of the present invention.

FIG. 1 is a cross-sectional view which shows the general structure of a CIS-based thin film solar cell according to an embodiment of the present invention. In the figure, reference numeral 1 indicates a substrate which is comprised of glass, plastic, metal sheet, etc. Reference numeral 2 indicates a backside electrode layer made of Mo, Ti, Cr, etc., 3 is a p-type light absorption layer which is comprised of a CIS-based semiconductor, 4 is a high resistance buffer layer which is made of Zn(O, S, OH), CdS, In$_2$S$_3$, etc., and 5 is a window layer which is formed by an n-type transparent conductive film which is made of ZnO, ITO, etc. Reference numeral 6 shows a plurality of voids which are formed at the interface between the backside electrode layer 2 and the p-type light absorption layer 3. As explained later, these are formed in the step of selenization of the metal precursor film, so they are filled with gas mainly comprised of nitrogen (nitrogen gas). Note that, the n-type transparent conductive film 5 may be formed with an antireflection film etc., on the surface.

Figure 2:
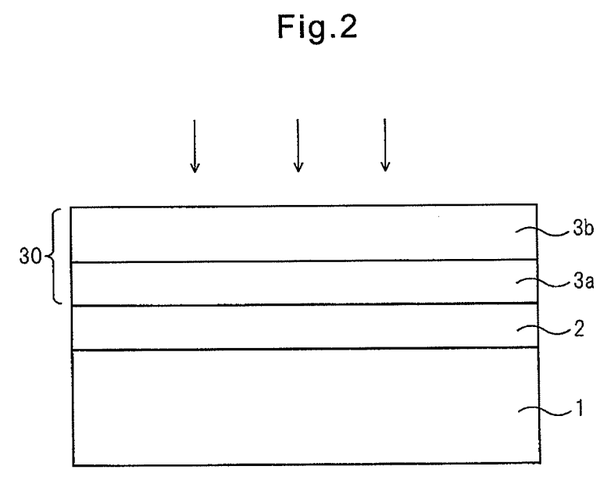
FIG. 2 is a view for explaining the process of formation of a p-type light absorption layer.

FIG. 2 is a schematic view for explaining the step of forming a p-type light absorption layer 3. A Mo or other backside electrode layer 2 is formed on the substrate 1, then, first, a CuGa layer 3a is deposited by sputtering, then an In layer 3b is similarly deposited by sputtering to form a metal precursor film 30. The CuGa layer 3a may be formed using CuGa as the sputter source. Furthermore, the metal precursor film 30 may be formed by Cu and In without using Ga or may be formed using Cu—Ga—In as a sputter source.

The thus formed metal precursor film 30 is next selenized/sulfurized. First, the substrate on which the metal precursor film 30 is formed is placed in a reaction furnace, H$_2$Se gas which has been diluted by N$_2$ gas etc. is introduced, then the substrate is raised in temperature to about 400° C. so as to promote a reaction of CuGa, In, and Se. When sulfurizing the metal precursor film 30, after selenization, the H$_2$Se gas is switched to dilute H$_2$S gas to promote sulfurization of the selenide. As a result, a Cu(In, Ga)Se$_2$, Cu(In, Ga)(Se, S)$_2$, or other p-type light absorption layer 3 (FIG. 1) is formed on the backside electrode layer 2.

As explained in the section on the background art, in the above selenization step, the metal precursor film 30 expands in volume in the selenization step, so sometimes the strain caused by this expansion of volume causes the formation of voids in the p-type light absorption layer 3. In the past, such voids were considered to degrade the photovoltaic conversion characteristic of the p-type light absorption layer 3 and were prevented from being formed as much as possible. In this regard, the inventors discovered in the process of various experiments that by causing the formation of such voids concentrated at the interface of the backside electrode layer 2 and the p-type light absorption layer 3, the open circuit voltage (Voc) becomes higher at the formed CIS-based thin film solar cell.

Figure 3:
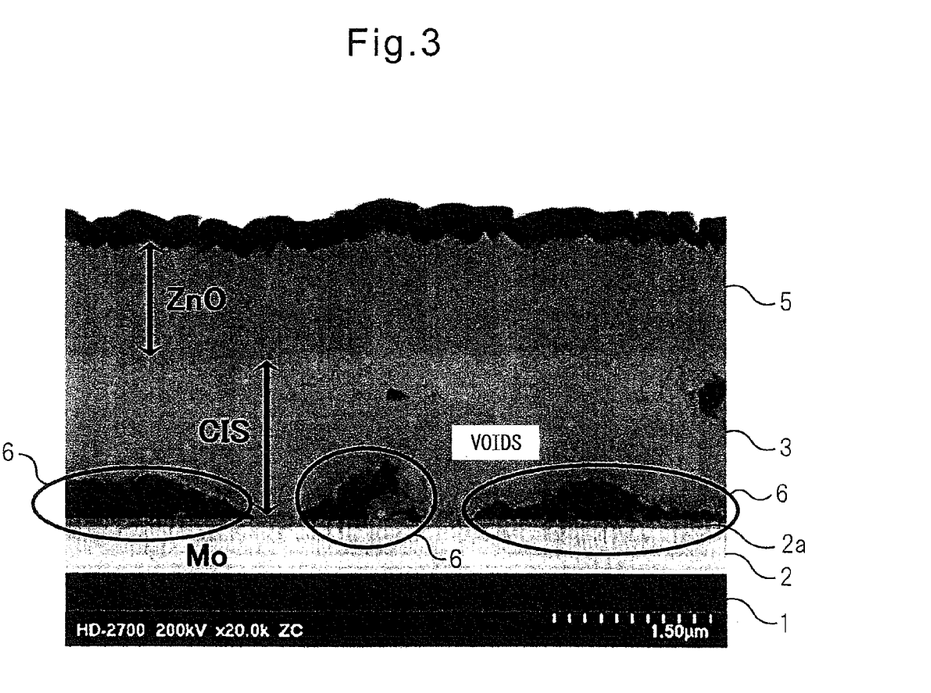
FIG. 3 is a SEM photograph of any cross-section of a CIS-based thin film solar cell according to one embodiment of the present invention.

FIG. 3 is a photograph of the above CIS-based thin film solar cell captured in cross-section by a scan type electron microscope (SEM) in which a rise of the open circuit voltage is seen. As shown, in this CIS-based thin film solar cell, the voids 6 are formed concentrated at the interface between the Mo backside electrode layer 2 and the p-type light absorption layer 3. As a result, it is understood that the contact area of the backside electrode layer 2 and the p-type light absorption layer 3 is considerably reduced compared with when voids 6 are not formed (full surface contact). The inside of the voids 6 are filled with a gas mainly comprised of nitrogen. Further, in the process of selenization and sulfurization of the p-type light absorption layer (CIS layer) 3, the front surface of the backside electrode layer 2 is selenized and sulfurized whereby an intermediate layer 2a of Mo(SSe)$_2$ which functions as part of the electrodes is formed. It is understood that the voids 6 are formed on this intermediate layer 2a. Note that, in the present embodiment, as the step of forming the p-type light absorption layer, selenization and sulfurization were performed, but when using only selenization to form a p-type light absorption layer, the intermediate layer 2a becomes MoSe$_2$. When using only sulfurization to form a p-type light absorption layer, the intermediate layer 2a becomes MoS$_2$. Further, the n-type high resistance buffer layer 4 which is shown in FIG. 1 does not clearly appear in the SEM photograph of FIG. 3. This is because the n-type high resistance buffer layer 4 is an extremely thin layer of about tens of nm.

Since the voids 6 are filled with a gas mainly comprised of nitrogen gas, current never flows through the voids 6 to the backside electrode layer 2. Therefore, in the structure of FIG. 3, the carriers which are produced at the p-type light absorption layer 3 are believed to flow through the parts of the backside of the p-type light absorption layer 3 where no voids are formed to the backside electrode layer 2. In this way, it is learned that the voids 6 act to reduce the contact area of the p-type light absorption layer 3 and the backside electrode layer 2. If the contact area of the two is reduced, it is believed that the front surface recombination rate of the carriers will fall along with that. That is, it is believed that this structure realizes point contact at the backside electrode side.

Figure 4A:
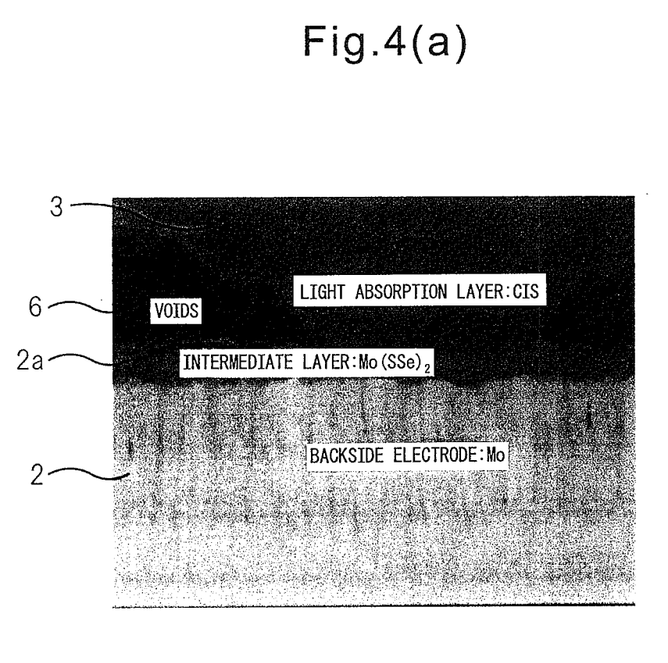
FIG. 4(a) is a HAADF-STEM image at the cross-section shown in FIG. 3.
Figure 4B:
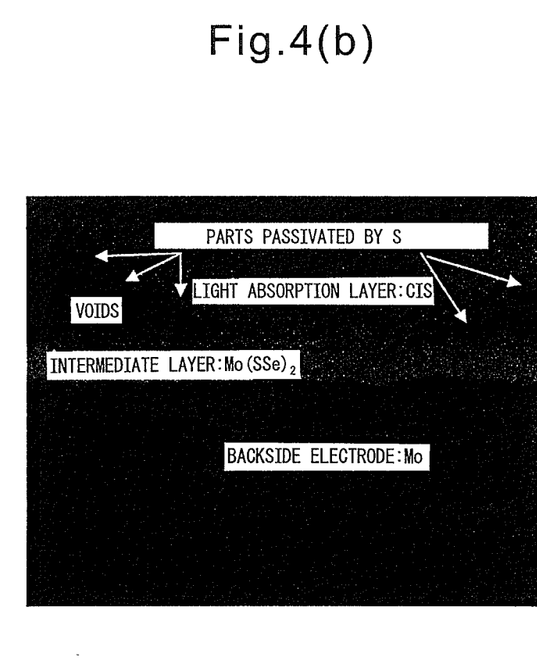
FIG. 4(b) shows S-mapping of the HAADF-STEM image which is shown in FIG. 4(a).

FIGS. 4(a), (b) show the results of capturing the parts where the backside electrode layer 2 and the p-type light absorption layer 3 contact in FIG. 3, using high-angle annular dark-field scanning transmission electron microscopy (HAADF-STEM) (FIG. 4(a)) and S (sulfur) mapping using electron energy loss spectroscopy (EELS) (FIG. 4(b)) respectively. From these figures, it is learned that the parts where the p-type light absorption layer contact the voids have S (sulfur) present at a high concentration, that is, the boundary parts are passivated by S. Due to this, it is believed that the front surface recombination rate of the carriers further falls. Note that, between the Mo backside electrode layer and p-type light absorption layer, as explained above, an intermediate layer 2a obtained by selenization and sulfurization of Mo (Mo(SSe)$_2$) is formed.

The voids 6 are not a vacuum and are filled by the gas in the furnace at the time of selenization of the metal precursor film (mainly nitrogen gas). The refractive index of this gas is about 1. On the other hand, the refractive index of the CIS forming the p-type light absorption layer 2 is 2.5 to 3.5. In this way, the difference in the refractive index of the voids and the CIS is large, so the reflectance of the light at the boundary is considerably large. Further, the front surfaces of the voids 6 have large slanted parts, so the incident light strikes the front surfaces of the voids at an incline and the reflectance further rises. As a result, the voids 6 act as backside reflectors (BSR), incident light which could not be absorbed at the p-type light absorption layer 3 is made to restrike the inside of the p-type light absorption layer 3 by a high reflectance, and the photovoltaic conversion efficiency of the CIS-based thin film solar cell is improved. Incidentally, the Mo(SSe)$_2$ which forms the intermediate layer 2a has a refractive index close to the CIS, so the reflectance between them is small and the BSR effect cannot be obtained.

In the above way, the voids present at the interface of the p-type light absorption layer 3 and the backside electrode layer 2 act to realize point contact and a BSR structure in a CIS-based thin film solar cell. As a result, it is believed that a rise is seen in the open circuit voltage in the produced cell.

The inventors believed as a result of the above consideration that by deliberately providing voids at the interface of the p-type light absorption layer and the backside electrode layer, it is possible to obtain a CIS-based thin film solar cell which has a large open circuit voltage. They produced a plurality of CIS-based thin film solar cells which have voids by various ratios and measured the open circuit voltages of the devices.

FIGS. 5(a) to (d) show SEM images of the cross-sections of four CIS-based thin film solar cells which were prepared while changing the method of production of the p-type light absorption layer (Samples 1 to 3 are examples of the present invention, while Sample 4 is a comparative example to the present invention). In FIG. 6, the relationship between the ratio of voids and the open circuit voltage was graphed for Samples 1 to 4 of FIG. 5. Note that, the voids 6 spread two dimensionally at the interface of the backside electrode layer 2 and the p-type light absorption layer 3, but actual measurement of the area is difficult, so the ratio of voids was expressed by making the ratio of the part in the length direction of the backside electrode layer at any cross-section of the solar cell where the backside electrode layer and the p-type light absorption layer contact to the overall length the "contact ratio" (in FIG. 6, shown by %). That is, at any cross-section of the CIS-based thin film solar cell, Contact ratio=(length by which backside electrode layer contacts p-type light absorption layer)/ (length of backside electrode layer)

Therefore, the larger the contact ratio, the smaller the voids.

Figure 5A:
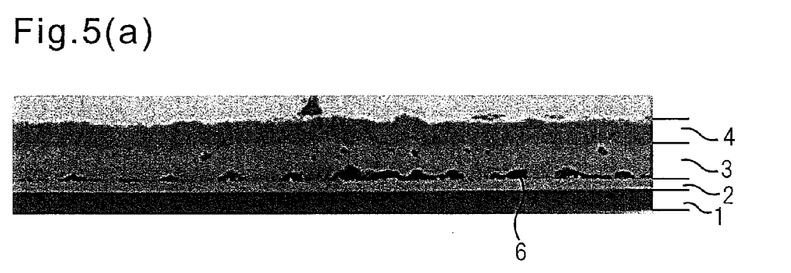
FIG. 5(a) is a SEM photograph of any cross-section of a CIS-based thin film solar cell according to one embodiment of the present invention.
Figure 5B:
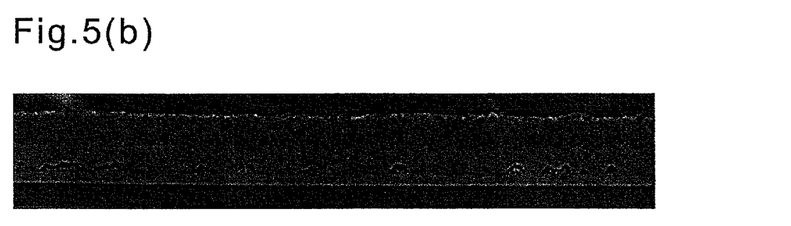
FIG. 5(b) is a SEM photograph of any cross-section of a CIS-based thin film solar cell according to another embodiment of the present invention.
Figure 5C:
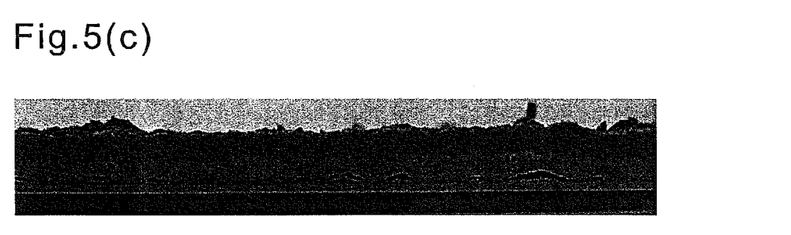
FIG. 5(c) is a SEM photograph of any cross-section of a CIS-based thin film solar cell according to still another embodiment of the present invention.
Figure 5D:
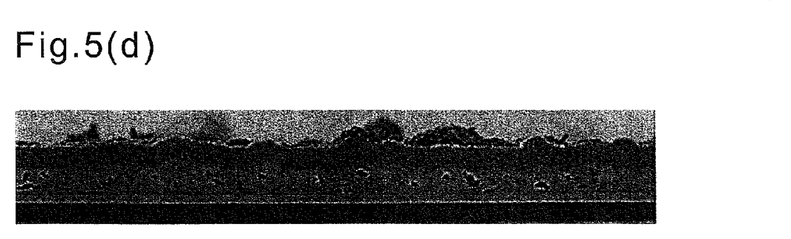
FIG. 5(d) is a SEM photograph of any cross-section of a conventional CIS-based thin film solar cell.
Figure 6:
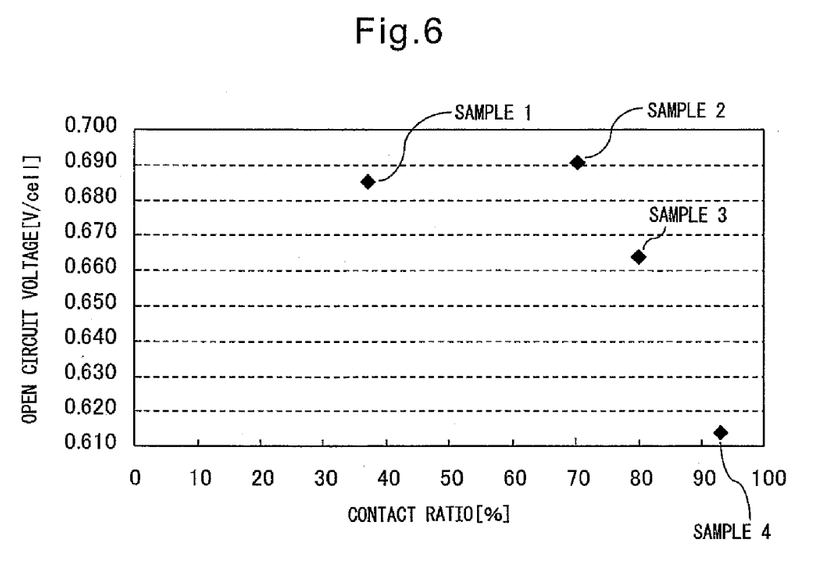
FIG. 6 is a graph which shows the relationship between the contact ratio at the backside electrode and the open circuit voltage of the CIS-based thin film solar cells shown in FIG. 5(a) to FIG. 5(d).

Sample 1 of FIG. 5(a) had an open circuit voltage of 0.685V at a contact ratio of 37%. Sample 2 of FIG. 5(b) had an open circuit voltage of 0.691V at a contact ratio of 70%, and sample 3 of FIG. 5(c) had an open circuit voltage of 0.664V at a contact ratio of 80%. On the other hand, sample 4 of FIG. 5(d) had an open circuit voltage of 0.614V at a contact ratio of 93%. FIG. 6 plots the relationship between the contact ratio and the open circuit voltage of the samples. As clear from this figure, if the contact ratio falls from 93% to 80%, the open circuit voltage of the sample is greatly improved. Furthermore, if the contact ratio falls to 70%, the open circuit voltage becomes the highest value in the measured samples. On the other hand, even if the contact ratio falls further to 37%, the open circuit voltage is not that different from when the contact ratio is 70% or falls slightly.

From the above results, it is understood that the Samples 1 to 3 which have 20% or more voids (contact ratio of 80% or less) have higher open circuit voltages than the Sample 4 which has almost no voids and therefore have higher photovoltaic conversion efficiencies. This is believed to be because the presence of voids promotes the effect of the above-mentioned point contact structure and BSR structure and leads to improvement of the photovoltaic conversion efficiency. Note that, there are no measurement values for the lower limit value of the contact ratio, but for crystalline Si, it is considered that the smaller the area occupied by the backside contacts, the better. Therefore, in the CIS-based thin film solar cell of the present invention as well, even if making the contact ratio considerably low (10% or less), it is believed possible to expect a high open circuit voltage compared with a CIS-based thin film solar cell not having almost any voids.

Table 1 shows part of the production process for Samples 1 to 4 which are shown in FIG. 5(a) to FIG. 5(d) and FIG. 6.

TABLE 1

|  | Contact ratio [%] | Open circuit voltage [V/cell] | CuGa film forming power [kW] | |
|---|---|---|---|---|
|  |  |  | First layer (backside electrode side) | Second layer side (light receiving surface side) |
| Sample 1 | 37 | 0.685 | 1.68 | 0.46 |
| Sample 2 | 70 | 0.691 | 1.23 | 0.60 |
| Sample 3 | 80 | 0.664 | 1.46 | 0.72 |
| Sample 4 (Prior art) | 93 | 0.614 | 1.08 | 1.08 |

Below, while referring to the above Table 1, the method of formation of voids at the interface of the backside electrode layer and p-type light absorption layer by, for example, a ratio of 20% (contact ratio of 80%) or more will be explained.

If heat treating the metal precursor film of CuGa/In as shown in FIG. 2 by the selenization/sulfurization method, a $Cu(InGa)(SeS)_2$ light absorption layer is obtained. Under conventional film forming conditions, a CuGa layer easily grows in a columnar shape by being influenced by the shape of the front surface of the underlying Mo. Therefore, there are few crystal grain boundaries. Further, the speed of temperature rise of the selenization is also relatively moderate, so the reaction from above the In film (light receiving surface side) is dominant. If the reaction from the light receiving surface side is dominant, the amount of volume expansion is released upward at the open space in accordance with the reaction, so strain is comparatively difficult to accumulate and few voids are formed. Sample 4 of Table 1 was prepared under such conventional film forming conditions. Therefore, almost no voids are formed at the interface of the backside electrode layer and the p-type light absorption layer.

On the other hand, when forming the CuGa film, by keeping down the film forming power of the sputtering, it is possible to not grow the CuGa film in a columnar shape, in other words, it is possible to form a CuGa film with a small crystal grain size. In a CuGa film with a small crystal grain size, the crystal grain boundaries become greater in number and Se easily penetrates to the backside electrode side through the crystal grain boundary. As a result, at the initial stage of selenization, the amount of supply of selenization gas downward increases and a reaction with Se (volume expansion) advances even at the CuGa film at the backside electrode side. If volume expansion proceeds at the backside electrode side, there is no longer a path for escape of the strain accompanying it and voids are formed at the interface of the backside electrode layer and the p-type light absorption layer. Therefore, to deliberately form voids at the interface of the backside electrode layer and the p-type light absorption layer, it is effective to not grow the CuGa film as a columnar shape but to make the crystal grain size as small as possible (for example, 50 nm to 100 nm or so).

In Samples 1 to 3 of Table 1, the CuGa film is made by two layers and the second layer CuGa film is made smaller in sputter power than the first layer. As a result, the second layer CuGa film becomes considerably small in crystal grain size (for example, 50 nm to 100 nm or so). Due to this, from the initial stage of selenization, Se passes through the CuGa film at the light receiving surface side and easily penetrates the CuGa film at the backside electrode side. Strain due to volume expansion builds up at the backside electrode side whereby voids are formed.

Note that, in Samples 1 to 3 which are shown in Table 1, the CuGa layer was formed by two layers, but this is to make the film thickness of the CuGa film of the first layer and second layer combined for the Samples 1 to 4 constant and make the film thickness of the CIS light absorption layer 1.3 to 1.5 µm. Therefore, even if forming the CuGa layer by a further greater number of layers or forming it by a single layer, if suitably selecting the crystal grain size (for example, 50 nm to 100 nm or so), it is possible to form the CIS-based thin film solar cell of the present invention.

Further, in the samples which are shown in Table 1, the precursor film was formed by making the CuGa film by two layers and depositing an In film over them, but the present invention is not limited to this. It may also be a Cu/Ga/In mixed crystal precursor film (Cu/In, Cu/Ga, Cu—Ga alloy/In, Cu—Ga—In alloy, etc.) In this case, it is possible to raise the reactivity between the backside electrode side of the precursor film and Se (or S) so as to form voids as in the above experimental results.

Further, as another method of providing voids, in the selenization of the metal precursor film, when raising the temperature of the substrate on which the precursor film is formed, the speed of temperature rise can be raised. Raising the speed of temperature rise of the substrate leads to a rise in the reactivity of the CuGa film at the backside electrode side and Se. As a result, strain occurs accompanying the volume expansion at the backside electrode side of the light absorption layer and voids can be formed between the backside electrode and the light absorption layer.

Note that, there are limits to raising the speed of temperature rise of the substrate unless using special equipment, but it is possible to raise the reactivity of Se while leaving the substrate temperature low. For example, by making the selenization gas contact a high temperature part, it is possible to raise the temperature of the selenization gas and raise the reactivity.

Summarizing the above, if providing the voids concentrated at the interface of the backside electrode and the p-type light absorption layer, it is possible to control the degree of formation of the voids by 1) controlling the film forming power of the sputter to reduce the crystal grain size of the metal precursor film and/or 2) raise the reactivity of the metal precursor film of the backside electrode side and the Se.

In the above, how the point contact and BSR structure were realized in the CIS-based thin film solar cell of the present invention was explained focusing on the step of formation of the voids. The other steps in producing the CIS-based thin film solar cell, that is, the step of forming the backside electrode layer 2 on the substrate, the step of forming the buffer layer 4, the step of forming the transparent conductive film 5, etc. may be the same as in the conventional method of production or may employ another method.

Below, the above method of formation of voids will be explained for the method of production of a CIS-based thin film solar cell according to an embodiment of the present invention using the method of production which has been already proposed by the applicant as Japanese Patent Application No. 2009-148768.

Figure 7:
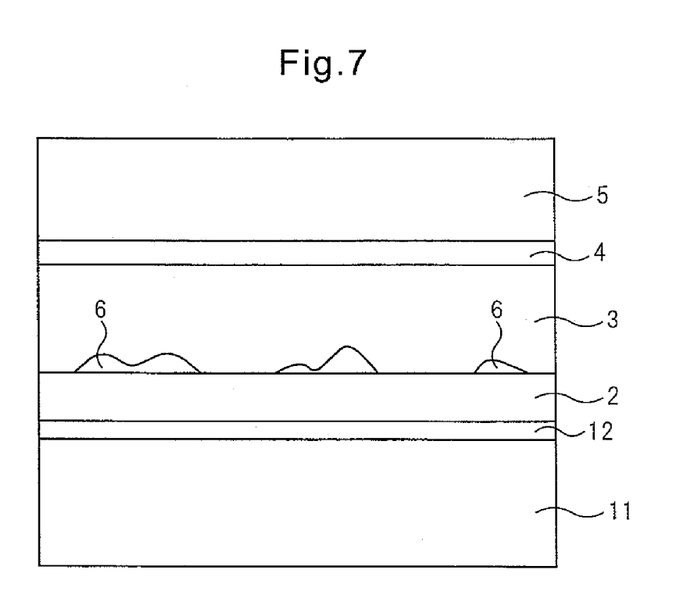
FIG. 7 is a cross-sectional view which shows the schematic structure of a CIS-based thin film solar cell according to another embodiment of the present invention.

FIG. 7 is a schematic cross-sectional view which shows the structure of a CIS-based thin film solar cell according to another embodiment of the present invention. Other than the substrate 11 and alkali control layer 12, the structure is basically the same as the CIS-based thin film solar cell which is shown in FIG. 1. In FIG. 7, 11 is a high strain point glass substrate which contains Na$_2$O: 3 to 5 wt %. Reference numeral 12 is an alkali control layer made of silica (SiO$_x$) with a film thickness of 3 to 5 nm and a refractive index of 1.47 to 1.49 in range. This refractive index is a value which is measured by light of a wavelength of 633 nm. The alkali control layer 12 controls the diffusion of Na from the substrate 11 to the p-type light absorption layer. In FIG. 7, furthermore, 2 indicates a backside electrode layer made of Mo, 3 indicates a p-type light absorption layer which is comprised of a CIS-based semiconductor, 4 indicates an n-type high resistance buffer layer, and 5 indicates a window layer which is formed by an n-type transparent conductive film. Note that, these may have the same configurations as the CIS-based thin film solar cell shown in FIG. 1. In this CIS-based thin film solar cell, in the same way as the solar cell which is shown in FIG. 1, a plurality of voids 6 are formed concentrated at the interface of the backside electrode layer 2 and the p-type light absorption layer 3.

Next, the structure and method of formation of the alkali control layer 12 will be explained. In the present embodiment, the alkali control layer 12 was formed by silica which has a film thickness of 3 to 5 nm and a refractive index of 1.47 to 1.49 (refractive index with respect to light of a wavelength of 633 nm). However, the present invention is not particularly limited to this value. The layer need only be a silica film with a film thickness of 1 to 10 nm and a refractive index of 1.45 to 1.49 in range.

Such an alkali control layer 12 can, for example, be formed by 1) the RF sputtering method, 2) the reactive sputtering method, and 3) the DC sputtering method. In this case, by changing the input power, O$_2$ ratio, and film-forming pressure as parameters, it is possible to form silica films which have various film thicknesses and refractive indexes. Note that, as other parameters, there are the gas flow rate, substrate transport speed, etc.

Examples of the parameters are given below:
Input power: 0.1 to 3 W/cm$^2$
O$_2$ ratio (O$_2$/O$_2$+Ar): 0 to 20%
Film-forming pressure: 0.3 to 1.5 Pa Note that, as the method of forming the alkali control layer 12, in addition to the above sputtering method, there are the plasma CVD method, electron beam vapor deposition method, etc. These methods may also be used to work the present invention.

The backside electrode 2 is usually formed by the DC sputtering method using Mo as a material. Table 2 shows the film thickness and method of formation of the film of the backside electrode 2.

TABLE 2

| Configuration of Backside Electrodes | |
| --- | --- |
| Film thickness | 200 to 500 nm |
| Method of formation | DC sputtering |
| | Film-forming pressure: 1.2 to 2.5 Pa |
| | Applied voltage: 1.0 to 3.0 W/cm$^2$ |

In the present embodiment, the addition of Na to the p-type light absorption layer 3 is realized by the Na which is contained in the glass substrate 11 being thermally diffused in this layer in the process of formation of the p-type light absorption layer 3.

Next, details of the p-type light absorption layer 3 will be shown.

The p-type light absorption layer 3 is formed by forming a Cu-, In-, and Ga-containing multilayer structure or mixed crystal metal precursor film by the sputtering method, vapor deposition method, etc., then selenizing and sulfurizing it. In one embodiment, the ratio of the number of atoms of Cu with respect to the number of atoms of the Group III elements of In and Ga (Cu/Group III ratio) is made 0.85 to 0.95, the ratio of the number of atoms of Ga with respect to the number of atoms of the Group III elements (Ga/Group III ratio) is made 0.15 to 0.4, and the selenization is performed at 350° C. to 500° C. and the sulfurization at 550° C. to 650° C. so as to form a thickness 1.3 to 1.5 μm light absorption layer which has a p-type conductivity.

In one embodiment, as the p-type light absorption layer 3, copper indium gallium diselenide/sulfide (Cu(InGa)(SeS)$_2$) was formed, but the present invention is not limited to this layer. Any Group I-III-VI$_2$ chalcopyrite semiconductor is possible.

For example,
copper indium diselenide (CuInSe$_2$)
copper indium disulfide (CuInS$_2$)
copper indium diselenium/sulfide (CuIn(SeS)$_2$)
copper gallium diselenide (CuGaSe$_2$)
copper gallium disulfide (CuGaS$_2$)
copper indium gallium diselenide (Cu(InGa)Se$_2$)
copper indium gallium disulfide (Cu(InGa)S$_2$), etc. are also possible.

In another embodiment, as the method of adding Na to a p-type light absorption layer 3, not only is Na thermally diffused from the glass substrate 11, but also Na is included together with the precursor film material (for example, CuGa) in the sputter target or vapor deposition source at the time of forming a Cu-, In-, Ga-containing multilayer structure or mixed crystal metal precursor film on the backside electrode layer 2 by the sputtering method, vapor deposition method, etc. Due to this, a metal precursor film containing Na is formed. This Na diffuses by heat throughout the p-type light absorption layer in the subsequent selenization and sulfurization process. As a result, a p-type light absorption layer uniformly containing Na is formed.

At the point of time of forming this metal precursor film, by using the conditions which were applied to the Samples 1 to 3 among the film forming conditions which are shown in the above Table 1, voids 6 are formed at the interface of the backside electrode layer 2 and the p-type light absorption layer 3 at the point of time of performing the later selenization/sulfurization step. The voids 6 are formed so that the crystal grain size of the metal precursor becomes smaller (for example, 50 to 100 nm or so) due to the film forming conditions which were applied to Samples 1 to 3. If the crystal grain size is small, in the subsequent selenization/sulfurization step, voids 6 are formed at the interface between the backside electrode layer 2 and the p-type light absorption layer 3 as explained in detail relating to the structure of FIG. 1. The degree of formation of the voids can be selected by control of the size of the crystal grain size. Alternatively, it is possible to make the temperature of the reaction gas at the selenization/sulfurization step higher (for example, 600 to 800° C.) to form voids 6.

Next, details of the buffer layer 4 will be shown.

In the embodiment of FIG. 7, as the buffer layer 4, Zn(O, S, OH)$_x$ of a film thickness of 2 to 50 nm which has an n-type conductivity, is transparent, and is high in resistance is formed. This buffer layer 4 can be formed by the solution growth method or MOCVD method. Note that, here, as the buffer layer 4, a semiconductor film which is comprised of Zn(O, S, OH)$_x$ was formed, but the invention is not limited to this embodiment. For example, it may also be a CdS, ZnS, ZnO, or other Group II-VI compound semiconductor thin film, a mixed crystal $Zn(O,S)_x$ etc. of the same, a for example, $In_2O_3$, $In_2S_3$, $In_2S_3$, $In(OH)_x$, or other In-based compound semiconductor thin film.

Next, details of the window layer (transparent conductive film) 5 will be shown.

In the embodiment of FIG. 7, a semiconductor film which has an n-type conductivity, has a wide band gap, is transparent, low in resistance value, has a thickness of 0.5 to 2.5 μm, and is comprised of ZnO:B was formed. This window layer 5 can be formed by the sputtering method or MOCVD method. Further, in addition to the ZnO:B which was used in the present embodiment, ZnO:Al or ZnO:Ga may be used. Furthermore, a semiconductor film which is comprised of ITO is also possible.

In the above embodiment, to add Na to the p-type light absorption layer 3, heat diffusion of Na from the glass substrate 11 or Na is added in the precursor film, but the present invention is not limited to this. It is also possible to include Na in the sputter material which forms the backside electrode layer of Mo.

Furthermore, in other embodiments, it is possible to adopt the coating the substrate with a mist which contains the Na element and thereby adding a predetermined amount of Na into the p-type light absorption layer 3, 1) at a point of time after forming the alkali control layer 12 and before forming the backside electrode layer 2, 2) at a point of time after forming the backside electrode layer 2 and before forming the metal precursor film, 3) after forming the metal precursor film, or 4) at a point of time after forming the p-type light absorption layer 3 and annealing. In this case, Na is uniformly diffused for example by heat diffusion in the p-type light absorption layer by heat treatment accompanying selenization and sulfurization after mist coating.

Above, specific examples of the various embodiments of CIS-based thin film solar cells according to the present invention were explained based on experiments. However, the CIS-based thin film solar cell according to the present invention is not limited to the above embodiments and experiments. For example, the glass substrate is not limited to the high strain point glass which has the physical properties shown in Table 2. A typical glass substrate includes $Na_2O$ in a range of 1 to 7 wt %. Even if using such high strain point glass, the solar cell according to the present invention can be produced. Further, it is possible to use a high strain point glass outside of these conditions or blue sheet glass or another glass material so as to form a thin film solar cell according to the present invention. Furthermore, even if using alumina or other insulating substrate, a conductive substrate comprised of a metal, carbon, or other conductive material, or a semiconductor substrate comprised of silicon, it is possible to form a thin film solar cell according to the present invention.

Furthermore, as the backside electrode layer material, it is possible to use not only Mo, but also Ti, Cr, or other material which has selenium corrosion resistance. Further, for control of the amount of addition of Na to the p-type light absorption layer, it is possible to employ not only the method which is described in the Present Description, but also, for example, the methods described in above PLTs 1 and 2.

In the present embodiment, the method of formation of the p-type light absorption layer 3 was made a method using the selenization and sulfurization methods, but the present invention is not limited to this. Only selenization or only sulfurization is also possible. Furthermore, even if the p-type light absorption layer 3 is formed by the simultaneous vapor deposition method, by forming a point contact structure provided with voids 6 between the p-type light absorption layer 3 and the backside electrode layer 2, the effect of improvement of the open circuit voltage is exhibited.

Still further, in the present embodiment, as the p-type light absorption layer 3, a semiconductor layer comprised of a Group I-III-VI$_2$ compound is used, but the present invention is not limited to such a thin film solar cell. For example, in a CdTe or other Group II-VI compound semiconductor thin film solar cell etc., it is possible to form voids similar to the above embodiment between the light absorption layer and the backside electrode layer so as to realize point contact at the backside electrode layer side and improve the open circuit voltage.

The invention claimed is:

1. A thin film solar cell comprising:
a substrate,
a backside electrode layer disposed on the substrate,
a p-type light absorption layer which contains voids and is disposed on the backside electrode layer, and
an n-type transparent conductive film which is disposed on the p-type light absorption layer,
wherein the voids in the p-type light absorption layer are concentrated at the interface between the p-type light absorption layer and the backside electrode layer so that a contact ratio of the p-type light absorption layer and the backside electrode layer is 80% or less and 37% or more, and
thicknesses of the voids are smaller than a thickness of the p-type light absorption layer.

2. The thin film solar cell as set forth in claim 1, wherein the p-type light absorption layer is a semiconductor layer which is comprised of the Group I-III-VI$_2$.

3. The thin film solar cell as set forth in claim 2, wherein the degree of formation of the voids is one whereby the contact ratio between the backside electrode layer and the p-type light absorption layer at the interface becomes 70% or less.

4. The thin film solar cell as set forth in claim 2, wherein a surface of the p-type light absorption layer, which surface contacts the voids, is passivated by sulfur.

5. The thin film solar cell as set forth in claim 2, wherein the voids contain a gas mainly comprised of nitrogen.

6. The thin film solar cell as set forth in claim 5, wherein at a surface of the backside electrode layer at the light receiving surface side, an intermediate layer which is comprised of a compound of the Group VI element which forms the p-type light absorption layer and an element which forms the backside electrode layer is disposed.

7. The thin film solar cell as set forth in claim 6, wherein the voids are located between the intermediate layer and the p-type light absorption layer.

8. The thin film solar cell as set forth in claim 1, wherein the substrate and the backside electrode have an alkali control layer formed between them.

9. The thin film solar cell as set forth in claim 1, wherein the contact ratio of the p-type light absorption layer and the backside electrode layer is smaller than or equal to 70%.

* * * * *